(12) United States Patent
Becker et al.

(10) Patent No.: US 6,735,188 B1
(45) Date of Patent: May 11, 2004

(54) CHANNEL ENCODING AND DECODING METHOD AND APPARATUS

(75) Inventors: Donald W. Becker, Rancho Santa Fe, CA (US); William E. L. Leigh, Del Mar, CA (US)

(73) Assignee: Tachyon, Inc., San Diego, CA (US)

( * ) Notice: Subject to any disclaimer, the term of this patent is extended or adjusted under 35 U.S.C. 154(b) by 0 days.

(21) Appl. No.: 09/407,644

(22) Filed: Sep. 28, 1999

Related U.S. Application Data
(60) Provisional application No. 60/151,282, filed on Aug. 27, 1999.

(51) Int. Cl.$^7$ .......................... H04B 7/216; H04J 13/02
(52) U.S. Cl. ................. 370/342; 370/342; 370/350; 370/441; 370/447; 375/142; 375/145; 375/343; 455/450; 455/509; 455/522
(58) Field of Search ................. 370/329, 335, 370/341, 342, 350, 441, 445, 447, 461, 462, 503; 375/130, 140, 141, 142, 145, 146, 147, 149, 150, 279, 280, 308, 340, 343, 356; 455/450, 451, 452, 507, 509, 511, 515, 517, 522

(56) References Cited

U.S. PATENT DOCUMENTS

| | | |
|---|---|---|
| 3,241,067 A | 3/1966 | James et al. |
| 3,611,435 A | 10/1971 | Cooper |
| 3,818,453 A | 6/1974 | Schmidt et al. |
| 4,007,330 A | 2/1977 | Winters |
| 4,543,574 A | 9/1985 | Takagi et al. |
| 4,545,061 A | 10/1985 | Hileman |
| 4,555,782 A | 11/1985 | Alaria et al. |
| 4,649,543 A | 3/1987 | Levine |
| 4,736,371 A | 4/1988 | Tejima et al. |
| 4,763,325 A | 8/1988 | Wolfe et al. |
| 4,774,707 A | 9/1988 | Raychaudhuri |
| 4,811,200 A | 3/1989 | Wagner et al. |
| 4,837,786 A | 6/1989 | Gurantz et al. |
| 4,841,527 A | 6/1989 | Raychaudhuri et al. |
| 4,868,795 A | 9/1989 | McDavid et al. |
| 5,012,469 A | 4/1991 | Sardana |
| 5,121,387 A | 6/1992 | Gerhardt et al. |
| 5,159,592 A | 10/1992 | Perkins |
| 5,166,929 A | 11/1992 | Lo |
| 5,172,375 A | 12/1992 | Kou |
| 5,216,427 A | 6/1993 | Yan et al. |
| 5,239,677 A | 8/1993 | Jasinski |

(List continued on next page.)

FOREIGN PATENT DOCUMENTS

| | | |
|---|---|---|
| EP | 0 026 603 | 4/1981 |
| EP | 0 097 309 | 1/1984 |

(List continued on next page.)

OTHER PUBLICATIONS

Copy of International Search Report, International Application No. PCTUS00/23330, International Filing Date Aug. 24, 2000.

Primary Examiner—Alpus H. Hsu
(74) Attorney, Agent, or Firm—Knobbe, Martens, Olson & Bear, LLP

(57) ABSTRACT

A method and apparatus related to a communication system in which a plurality of remote units encode data bursts using a predetermined codeword set and transmit the encoded data bursts to a hub station over a multiple-access channel. When the hub station receives a data burst from one of the remote units, the hub station demodulates the received data burst and correlates the received data burst with each codeword within the predetermined codeword set to determine which codeword has the maximum correlation. The hub station uses the correlation to derive a timing synchronization signal and/or a carrier frequency adjustment signal to be sent back to the remote unit. The signals provide information to the remote unit to synchronize its timing or adjust its carrier frequency for transmitting subsequent data bursts. The hub station may also use the correlation to estimate a signal-to-noise ratio.

14 Claims, 6 Drawing Sheets

U.S. PATENT DOCUMENTS

| | | |
|---|---|---|
| 5,276,703 A | 1/1994 | Budin et al. |
| 5,297,144 A | 3/1994 | Gilbert et al. |
| 5,345,583 A | 9/1994 | Davis |
| 5,381,443 A | 1/1995 | Borth et al. |
| 5,384,777 A | 1/1995 | Ahmadi et al. |
| 5,420,864 A | 5/1995 | Dahlin et al. |
| 5,430,760 A | 7/1995 | Dent ........................ 375/200 |
| 5,463,660 A * | 10/1995 | Fukasawa et al. .......... 375/205 |
| 5,471,473 A | 11/1995 | Tejima |
| 5,485,464 A | 1/1996 | Strodtbeck et al. |
| 5,490,087 A | 2/1996 | Redden et al. |
| 5,537,397 A | 7/1996 | Abramson |
| 5,539,730 A | 7/1996 | Dent |
| 5,541,924 A | 7/1996 | Tran et al. |
| 5,550,992 A | 8/1996 | Hashimoto |
| 5,566,168 A | 10/1996 | Dent |
| 5,570,355 A | 10/1996 | Dail et al. |
| 5,577,024 A | 11/1996 | Malkamaki et al. |
| 5,579,345 A | 11/1996 | Kroeger et al. |
| 5,586,121 A | 12/1996 | Moura et al. |
| 5,612,703 A | 3/1997 | Mallinckrodt |
| 5,613,195 A | 3/1997 | Ooi |
| 5,615,212 A | 3/1997 | Ruszczyk et al. |
| 5,638,361 A | 6/1997 | Ohlson et al. |
| 5,642,354 A | 6/1997 | Spear |
| 5,644,576 A | 7/1997 | Bauchot et al. |
| 5,651,009 A | 7/1997 | Perreault et al. |
| 5,652,892 A | 7/1997 | Ugajin |
| 5,659,545 A | 8/1997 | Sowles et al. |
| 5,673,322 A | 9/1997 | Pepe et al. |
| 5,677,909 A | 10/1997 | Heide |
| 5,678,208 A | 10/1997 | Kowalewski et al. |
| 5,696,903 A | 12/1997 | Mahany |
| 5,704,038 A | 12/1997 | Mueller et al. |
| 5,706,278 A | 1/1998 | Robillard et al. |
| 5,732,328 A | 3/1998 | Mitra et al. |
| 5,734,833 A | 3/1998 | Chiu et al. |
| 5,745,485 A | 4/1998 | Abramson |
| 5,758,088 A | 5/1998 | Bezaire et al. |
| 5,768,254 A | 6/1998 | Papadopoulos et al. |
| 5,790,533 A | 8/1998 | Burke et al. |
| 5,790,535 A | 8/1998 | Kou |
| 5,790,551 A | 8/1998 | Chan |
| 5,790,939 A | 8/1998 | Malcolm et al. |
| 5,790,940 A | 8/1998 | Laborde et al. |
| 5,796,726 A | 8/1998 | Hassan et al. |
| 5,802,061 A | 9/1998 | Agarwal |
| 5,809,093 A | 9/1998 | Cooper |
| 5,809,400 A | 9/1998 | Abramsky et al. |
| 5,809,414 A | 9/1998 | Coverdale et al. |
| 5,815,652 A | 9/1998 | Ote et al. |
| 5,815,798 A | 9/1998 | Bhagalia et al. |
| 5,818,831 A | 10/1998 | Otonari |
| 5,818,845 A | 10/1998 | Moura et al. |
| 5,818,887 A | 10/1998 | Sexton et al. |
| 5,822,311 A | 10/1998 | Hassan et al. |
| 5,828,655 A | 10/1998 | Moura et al. |
| 5,848,064 A | 12/1998 | Cowan |
| 5,859,852 A | 1/1999 | Moura et al. |
| 5,862,452 A | 1/1999 | Cudak et al. |
| 5,872,820 A | 2/1999 | Upadrasta |
| 5,889,766 A | 3/1999 | Ohnishi et al. |
| 5,905,719 A | 5/1999 | Arnold et al. |
| 5,909,447 A | 6/1999 | Cox et al. |
| 5,910,945 A | 6/1999 | Garrison et al. |
| 5,915,207 A | 6/1999 | Dao et al. |
| 5,926,458 A | 7/1999 | Yin |
| 5,946,602 A | 8/1999 | Sayegh |
| 5,958,018 A | 9/1999 | Eng et al. |
| 5,959,982 A | 9/1999 | Federkins et al. |
| 5,960,001 A | 9/1999 | Shaffer et al. |
| 5,963,557 A | 10/1999 | Eng |
| 5,966,412 A | 10/1999 | Ramaswamy |
| 5,966,636 A | 10/1999 | Corrigan et al. |
| 6,016,330 A * | 1/2000 | Ashley et al. .............. 375/341 |
| 6,091,703 A * | 7/2000 | Saunders et al. ........... 370/210 |
| 6,115,411 A * | 9/2000 | van Driest .................. 375/200 |
| 6,226,315 B1 * | 5/2001 | Sriram et al. ............... 375/140 |
| 6,426,978 B1 * | 7/2002 | Bottomley et al. ......... 375/265 |
| 6,456,646 B1 * | 9/2002 | Asokan et al. .............. 375/142 |

FOREIGN PATENT DOCUMENTS

| | | |
|---|---|---|
| EP | 0 584 820 A1 | 3/1994 |
| EP | 0 722 228 A2 | 7/1996 |
| EP | 0 755 164 A2 | 1/1997 |
| EP | 0 889 660 A2 | 1/1999 |
| EP | 0 889 664 A2 | 1/1999 |
| EP | 0 901 253 A2 | 3/1999 |
| EP | 0 912 015 A2 | 4/1999 |
| EP | 0 912 016 A2 | 4/1999 |
| EP | 0 913 968 A1 | 5/1999 |
| EP | 0 913 970 A1 | 5/1999 |
| EP | 0 915 592 A1 | 5/1999 |
| EP | 0 917 317 A1 | 5/1999 |
| EP | 0 920 226 A2 | 6/1999 |
| EP | 0 923 266 | 6/1999 |
| WO | 98/12829 | 3/1968 |
| WO | WO93/11605 | 6/1993 |
| WO | 94/19530 | 9/1994 |
| WO | 95/34153 | 12/1995 |
| WO | 96/05690 | 2/1996 |
| WO | 96/11535 | 4/1996 |
| WO | 97/11566 | 3/1997 |
| WO | 07/38502 | 10/1997 |
| WO | 97/37457 | 10/1997 |
| WO | 97/47158 | 12/1997 |
| WO | 97/50249 | 12/1997 |
| WO | 98/12833 | 3/1998 |
| WO | 98/19466 | 5/1998 |
| WO | 98/20724 | 5/1998 |
| WO | 98/23112 | 5/1998 |
| WO | 98/24250 | 6/1998 |
| WO | 98/37669 | 8/1998 |
| WO | 98/37706 | 8/1998 |
| WO | 98/44747 | 10/1998 |
| WO | 98/47236 | 10/1998 |
| WO | 98/49625 | 11/1998 |
| WO | 98/54858 | 12/1998 |
| WO | 98/54859 | 12/1998 |
| WO | 99/04338 | 1/1999 |
| WO | 99/04508 | 1/1999 |
| WO | 99/04509 | 1/1999 |
| WO | 99/04521 | 1/1999 |
| WO | 99/05828 | 2/1999 |
| WO | 99/13616 | 3/1999 |
| WO | 99/14963 | 3/1999 |
| WO | 98/16046 | 4/1999 |
| WO | 99/16201 | 4/1999 |
| WO | 99/19996 | 4/1999 |
| WO | 99/19999 | 4/1999 |
| WO | 99/21287 | 4/1999 |
| WO | 99/21291 | 4/1999 |
| WO | 99/21296 | 4/1999 |
| WO | 99/21328 | 4/1999 |
| WO | 99/21329 | 4/1999 |
| WO | 99/21378 | 4/1999 |
| WO | 99/21381 | 4/1999 |
| WO | 99/22500 | 6/1999 |
| WO | 99/39480 | 8/1999 |

* cited by examiner

CHANNEL ENCODING AND DECODING METHOD AND APPARATUS

RELATED APPLICATION

This application claims priority under 35 U.S.C. §119(e) to U.S. Provisional Application No. 60/151,282, filed on Aug. 27, 1999, and entitled "SYSTEM AND METHOD FOR WIRELESS INTERNET SERVICE," the entirety of which is incorporated herein by reference.

BACKGROUND OF THE INVENTION

1. Field of the Invention

The present invention relates generally to communication systems. Specifically, the invention relates to a method and apparatus for facilitating the reliable transfer of short, bursty messages over a wireless communications link.

2. Description of the Related Art

The use of wireless communication systems for the transmission of digital data is becoming more and more pervasive. In a wireless system, the most precious resource in terms of cost and availability is typically the wireless link itself. Therefore, one major design goal in designing a communication system comprising a wireless link is to efficiently use the available capacity of the wireless link. In addition, it is also desirable to reduce the delay associated with use of the link.

In a digital data system, remote units tend to generate bursty data to a hub station. The bursty data is characterized in that it has a high peak-to-average traffic ratio, meaning that blocks of data are transferred during short periods of time interposed between significantly longer periods of idleness.

In a time division multiple-access (TDMA) communication system, a separate time slot channel is assigned or dedicated to each remote unit. The remote unit uses the assigned time slot channel to transmit data to a hub station. By limiting transmissions to fall within the assigned time slot, the remote units are able to share the communication resources provided by the hub station. A TDMA system is effectively utilized when the transmission times and time slots of the remote units are all properly synchronized with each other.

In a TDMA system in which units have a pattern of use that includes bursty data, dedication of an individual time slot channel to each active remote unit does not result in efficient use of system capacity. This is because during those times when a remote unit is not utilizing the system, the time slot channel remains idle.

In a communication system with a plurality of remote units and a hub station, the hub station may detect when a remote unit has sent a burst to the hub station, determine the data content of the burst, and generate commands, such as timing synchronization signals, to feed back to the remote unit.

In present communication systems, the burst from a remote unit to the hub station typically includes a preamble which is used by the hub station to detect the burst. The added bits of the preamble increases the length of the burst and increases the duration of the time slot required by each remote unit. The more remote units in a system, the longer it takes the hub station to detect and process data bursts with their preambles. Furthermore, if the data bits in the burst are short, the preamble may be larger than the data bits. This results in an inefficient use of valuable system resources.

Thus, there is a need for a multiple-access system which provides advantageous use of system resources.

SUMMARY

The present invention relates to a method and apparatus for facilitating the reliable transfer of short, bursty messages over a wireless communications link or channel. Specifically, the invention relates to a communication system in which a plurality of remote units encode data bursts using a predetermined codeword set and transmit the encoded data bursts to a hub station over a multiple-access channel. When the hub station receives a data burst from one of the remote units, the hub station resamples the data burst at a plurality of different timing offsets and/or carrier frequency offsets. The hub station correlates the received data burst with each codeword within the predetermined codeword set to determine which codeword has the maximum correlation. The hub station then correlates the codeword (with the maximum correlation) with the plurality of different timing and/or carrier frequency offset samples and derives a timing synchronization signal and/or a carrier frequency adjustment signal to be sent back to the remote unit. The signals provide information to the remote unit to synchronize its timing or adjust its carrier frequency for transmitting subsequent data bursts. The hub station may also use the results of the correlations to estimate a signal-to-noise ratio.

There are several features or advantages of the present invention. First, in one embodiment related to encoding the data bursts, a QPSK codeword set is advantageously created such that each codeword has the same distance configuration from neighboring codewords, i.e., each codeword has the same number of codewords at a given distance as all of the other codewords. This advantageously gives each codeword equal noise immunity. The entire codeword data set is also advantageously created to perform well in low signal-to-noise environments for low probability of transmission error.

Second, the remote units preferably encode data bursts with a non-coherent code. Use of a non-coherent code advantageously does not require the determination of a carrier phase associated with the encoded burst during demodulation (at the hub station).

Third, in one embodiment, each burst is relatively short and does not include a preamble. This reduces the amount of data sent via the channel and the resources required to code and decode any preamble bits. A short burst also allows the channel to accommodate a large number of frequent transmissions or opportunities to transmit via the channel from a large number of remote units.

Fourth, in one embodiment, the channel demodulation employs a correlation-based scheme that can advantageously estimate the signal in the presence of noise. This ability allows the channel to be less susceptible to corruption by noise and to operate in a relatively low signal-to-noise ratio environment.

Fifth, in one embodiment, the channel demodulation comprises a substantially uncomplicated correlation-based architecture. This feature facilitates a highly vectorized and pipelined implementation that may be executed rapidly on a current microprocessor-based system. Thus, no tradeoff in the speed of demodulation is required to optimally and accurately demodulate the signal received via the reservation channel.

Sixth, in one embodiment, the hub station derives a timing adjustment signal to be sent back to the remote unit after a burst or number of bursts have been received and processed by the hub station. There is preferably no adjustment to the transmission timing of the remote unit while the hub station is receiving and processing a burst from that particular remote unit. This reduces the time for the hub station to receive and process each burst. This allows a large number of remote units to access the channel and the hub station to process the messages received via the channel quickly and efficiently.

Seventh, in one embodiment, the hub station derives a carrier frequency adjustment signal to be sent back to the remote unit after a burst or number of bursts have been received and processed by the hub station. There is preferably no adjustment to the carrier frequency of the remote unit while the hub station is receiving and processing a burst from that particular remote unit. This reduces the time for the hub station to receive and process each burst. This allows a large number of remote units to access the channel and the hub station to process the messages received via the channel quickly and efficiently.

One aspect of the invention relates to a method of communicating in which a plurality of remote units transmit data to a hub station. The method comprises receiving a data burst from a remote unit where the data burst is encoded using a predetermined codeword set. The method further comprises resampling the data burst received by the hub station at a plurality of different timing offsets and correlating the data burst received by the hub station with the codeword set to find the codeword with the maximum correlation. The method further comprises correlating the codeword (with the maximum correlation) with the plurality of different timing offset samples and deriving a timing synchronization signal to be sent back to the remote unit. The timing synchronization signal provides information to the remote unit to synchronize its timing for transmitting subsequent data bursts.

Another aspect of the invention relates to a method similar to the one described above except the method includes deriving a carrier frequency adjustment signal, instead of or in addition to the timing synchronization signal, to be sent back to the remote unit. The carrier frequency adjustment signal provides information to the remote unit to adjust its carrier frequency for transmitting subsequent data bursts.

Another aspect of the invention relates to a method of communicating in a communication system in which a plurality of remote units transmit data to a hub station. The method comprises transmitting a data burst from a remote unit to the hub station over a non-contention, multiple-access channel. The method further comprises performing a plurality of complex correlations with the burst received by the hub station and estimating a signal-to-noise ratio of the non-contention access channel based on the complex correlations.

Another aspect of the invention relates to a method of accessing a system in which multiple remote units compete for limited communication resources. The method comprises transmitting a block of data over a contention-type access communication resource. The method further comprises encoding a corresponding notification message intended for the hub station using a non-coherent quadrature phase shift keying code, and transmitting the encoded notification message over a reserved communication resource.

Another aspect of the invention relates to a remote unit comprising an encoder adapted to encode a notification burst using a predetermined codeword set. The notification burst is configured to notify the hub station that the remote unit has sent a data burst to the hub station via a contention-type resource. The remote unit further comprises a transmitter adapted to transmit the encoded data burst from the remote unit to a hub station by using a non-contention, multiple-access channel.

Another aspect of the invention relates to a hub station comprising a receiver, at least one matched filter, a microprocessor and a timing synchronization circuit. The receiver is adapted to receive a data burst from a remote unit. The matched filter is adapted to resample the received data burst at a plurality of different timing offsets. The microprocessor is adapted to correlate the received data burst with a plurality of codewords from a codeword set to find a codeword with maximum correlation. The timing synchronization circuit is adapted to send a signal back to the remote unit, which provides information to the remote unit to synchronize its timing for transmitting subsequent data bursts.

One application of the present invention relates to encoding and decoding data associated with a reserved block or reservation channel in a communication system, which comprises three communication resources: a contention-type access block, a non-contention-type access block and a second non-contention access block called the reservation channel. Each time a remote unit has a block of data to transfer to a hub station, it sends the block of data over the contention-type access block. It also sends a corresponding notification message over the reservation channel. If the hub station receives the notification message but not the block of data, it sends a response message to the remote unit which designates a resource within the non-contention access block. The remote unit sends the block of data over the designated resource.

BRIEF DESCRIPTION OF THE DRAWINGS

FIG. 4 illustrates one configuration of a set of codewords used in relation to the reserved block of FIG. 2.

DETAILED DESCRIPTION OF THE INVENTION

Communication System

The present invention relates to an efficient method and apparatus for facilitating the reliable transfer of short, bursty messages over a wireless communications link or channel. The description below describes a communication system in which the invention may be embodied. Specifically, the invention may be embodied in a reservation channel of the communication system. Alternatively, the invention may be used in other types of systems and/or applications.

Figure 1:
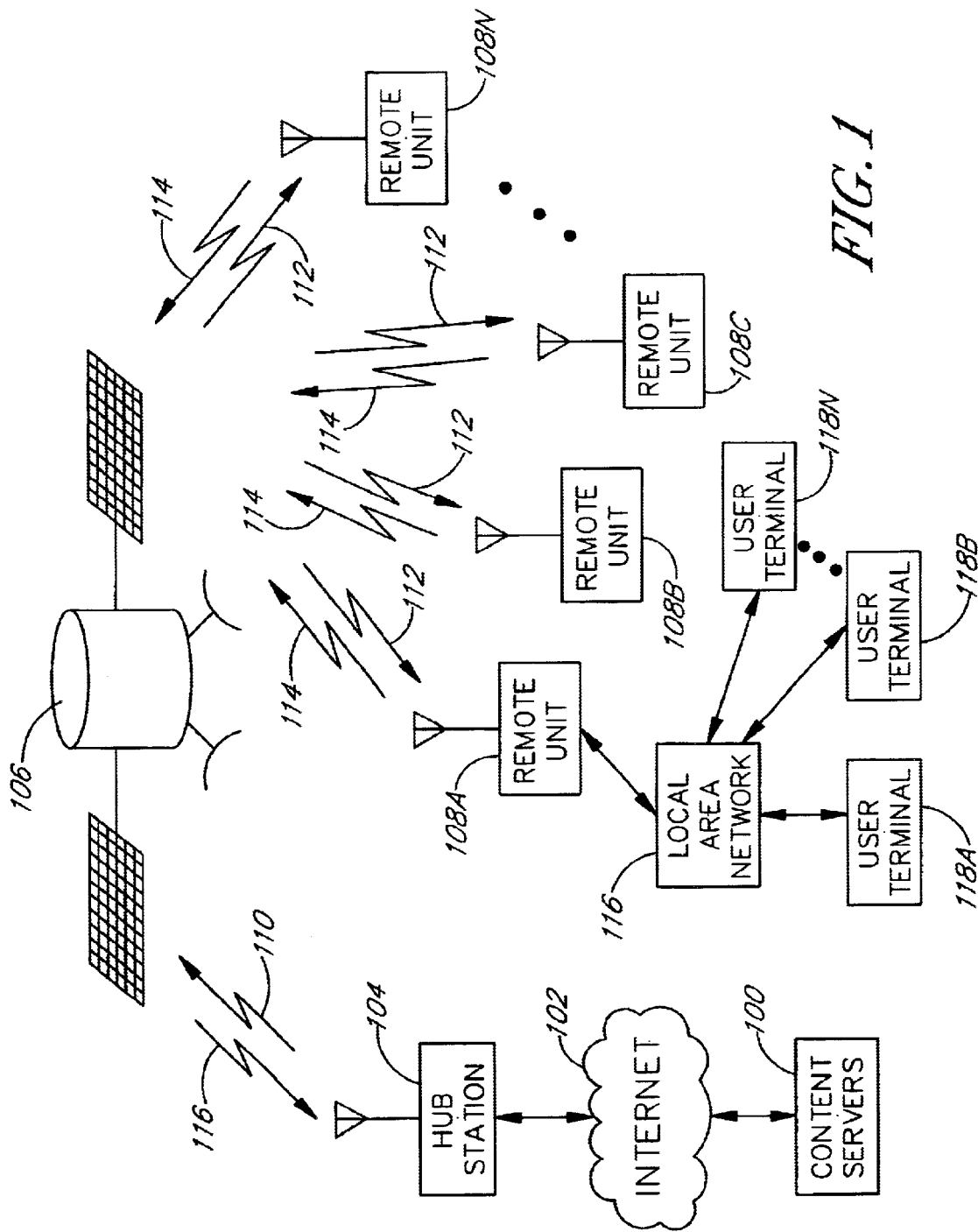
FIG. 1 is a block diagram illustrating an exemplifying system in which the invention may be embodied.

FIG. 1 is a block diagram illustrating an exemplifying system in which the invention may be embodied. The system in FIG. 1 provides high-speed, reliable Internet communication service over a satellite link.

In particular, in FIG. 1, content servers 100 are coupled to an Internet 102 which is in turn coupled to a hub station 104 such that the hub station 104 can request and receive digital data from the content servers 100. The hub station 104 also communicates via satellite 106 with a plurality of remote units 108A–108N. For example, the hub station 104 transmits signals over a forward uplink 110 to the satellite 106. The satellite 106 receives the signals from the forward uplink 110 and re-transmits them on a forward downlink 112. Together, the forward uplink 110 and the forward downlink 112 are referred to as the forward link. The remote units 108A–108N monitor one or more channels which comprise the forward link in order to receive remote-unit-specific and broadcast messages from the hub station 104.

In a similar manner, the remote units 108A–108N transmit signals over a reverse uplink 114 to the satellite 106. The satellite 106 receives the signals from the reverse uplink 114 and re-transmits them on a reverse downlink 116. Together, the reverse uplink 114 and the reverse downlink 116 are referred to as the reverse link. The hub station 104 monitors one or more channels which comprise the reverse link in order to extract messages from the remote units 108A–108N. For example, in one embodiment of the exemplifying system, the reverse link carries multiple-access channels in accordance with assignee's co-pending application entitled "METHOD AND APPARATUS FOR MULTIPLE-ACCESS IN A COMMUNICATION SYSTEM," application Ser. No. 09/407,639, filed concurrently herewith, the entirety of which is hereby incorporated by reference.

In one embodiment of the exemplifying system, each remote unit 108A–108N is coupled to a plurality of system users. For example, in FIG. 1, the remote unit 108A is shown as coupled to a local area network 116 which in turn is coupled to a group of user terminals 118A–118N. The user terminals 118A–118N may be one of many types of local area network nodes such as a personal or network computer, a printer, digital meter reading equipment or the like. When a message is received over the forward link intended for one of the user terminals 118A–118N, the remote unit 108A forwards it to the appropriate user terminal 118 over the local area network 116. Likewise, the user terminals 118A–118N can transmit messages to the remote unit 108A over the local area network 116.

In one embodiment of the exemplifying system, the remote units 108A–108N provide Internet service for a plurality of users. For example, assume that the user terminal 118A is a personal computer which executes browser software in order to access the World Wide Web. When the browser receives a request for a web page or embedded object from the user, the user terminal 118A creates a request message according to well-known techniques. The user terminal 118A forwards the request message over the local area network 116 to the remote unit 108A, also using well-known techniques. Based upon the request message, the remote unit 108A creates and transmits a wireless link request over a channel within the reverse uplink 114 and the reverse downlink 116. The hub station 104 receives the wireless link request over the reverse link. Based upon the wireless link request, the hub station 104 passes a request message to the appropriate content server 100 over the Internet 102.

In response, the content server 100 forwards the requested page or object to the hub station 104 over the Internet 102. The hub station 104 receives the requested page or object and creates a wireless link response. The hub station 104 transmits the wireless link response over a channel within the forward uplink 110 and forward downlink 112. For example, in one embodiment of the exemplifying system, the hub station 104 operates in accordance with assignee's co-pending application entitled "TRANSMISSION OF TCP/IP DATA OVER A WIRELESS COMMUNICATION CHANNEL," application Ser. No. 09/407,646, and assignee's co-pending application entitled "METHOD AND SYSTEM FOR FREQUENCY SPECTRUM RESOURCE ALLOCATION" application Ser. No. 09/407,645, each of which is filed concurrently herewith and the entirety of which is hereby incorporated by reference.

The remote unit 108A receives the wireless link response and forwards a corresponding response message to the user terminal 118A over the local area network 116. In one embodiment of the exemplifying system, the process of retrieving a web page or object is executed in accordance with assignee's co-pending application entitled "DISTRIBUTED SYSTEM AND METHOD FOR PREFETCHING OBJECTS," application Ser. No. 09/129,142, filed Aug. 5, 1998, the entirety of which is hereby incorporated by reference. In this way, a bi-directional link between the user terminal 118A and the content servers 100 is established.

Allocation of Communication Resources

Figure 2:
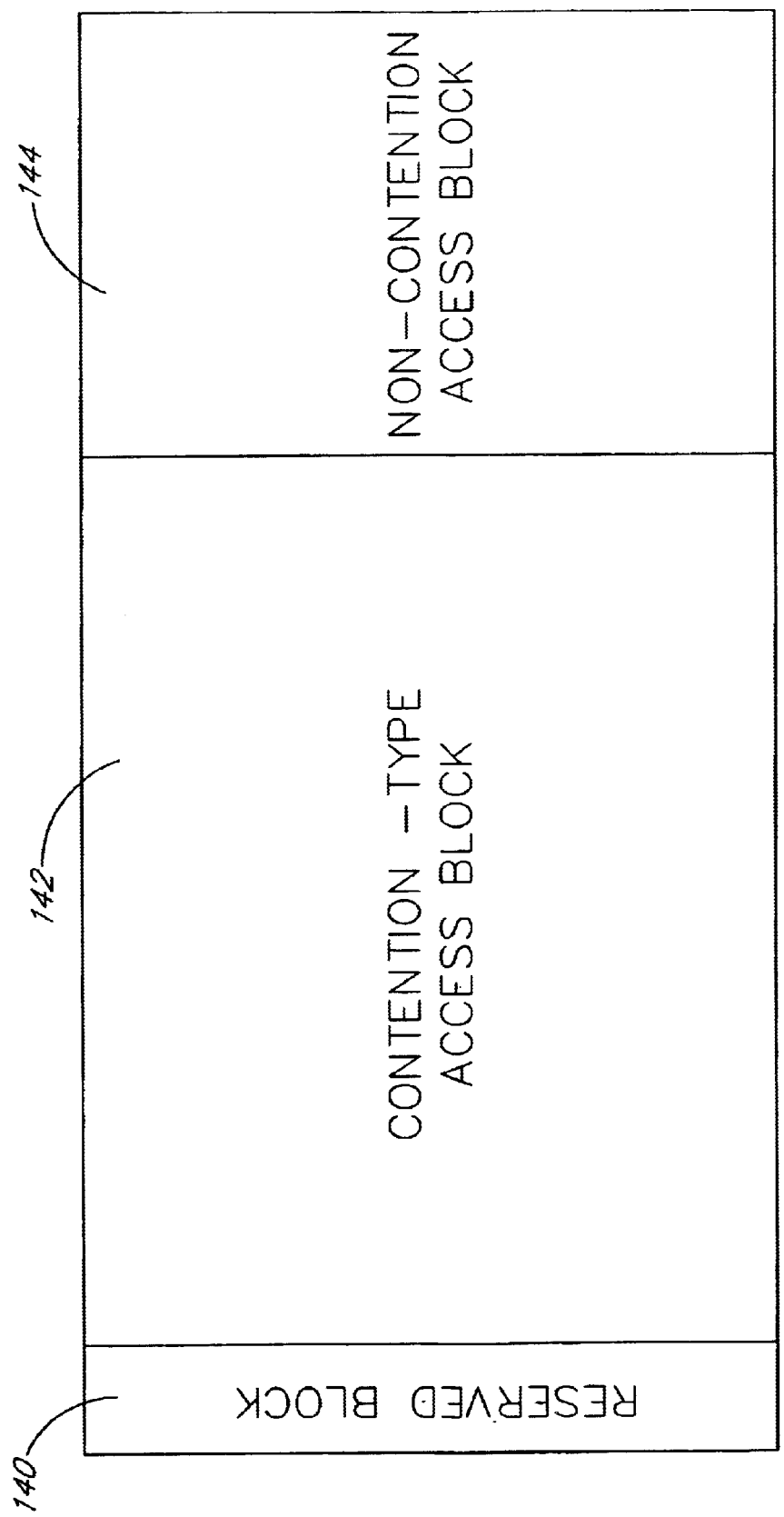
FIG. 2 is a conceptual diagram illustrating one embodiment of an allocation of communication resources, in the exemplifying system of FIG. 1, among a reserved block, a contention-type access block and a non-contention-type access block.

FIG. 2 is a conceptual diagram illustrating one embodiment of an allocation of communication resources, in the exemplifying system of FIG. 1, among a reserved block or reservation channel 140, a contention-type access block 142 and a non-contention-type access block 144. Together, the reserved block 140, the contention-type access block 142 and the non-contention-type access block 144 make up the reverse link 114, 116 shown in FIG. 1. The use and operation of these blocks 140–144 are disclosed in assignee's co-pending application entitled "METHOD AND APPARATUS FOR MULTIPLE-ACCESS IN A COMMUNICATION SYSTEM."

The reserved block 140 comprises a set of resources each of which is assigned and individually dedicated to an active remote unit 108 (FIG. 1). The reserved block 140 may be implemented as any one of a variety of well known non-contention access mechanisms in which the transmission from one remote unit 108 does not prevent another remote unit 108 from communicating. For example, the reserved block 140 may comprise a set of time multiplexed spread spectrum channels or a set of frequency division multiple-access (FDMA) or TDMA channels. The multiple-access and communication format of the reserved block 140 may be different from the remaining resource allocation blocks 142–144.

Functions of the Reservation Channel

As explained in the assignee's co-pending application "METHOD AND APPARATUS FOR MULTIPLE-ACCESS IN A COMMUNICATION SYSTEM," application Ser. No. 09/407,639, the reserved block 140 is used to notify the hub station 104 whenever a remote unit 108 attempts to access the system over the contention-type access block 142. The notification of the hub station 104 allows the hub station 104 to accurately detect the occurrence of a collision (or other failure mode) on the contention-type access block 142 and to identify the remote units 108 that were involved in the collision. In addition, the reserved block 140 can be used to request resources for the transmission of user data or notify the hub station 104 of the amount of user data currently available for transmission, as well as other tasks.

In one embodiment, the communication format used on the reserved block 140 results in a high probability of successful reception by the hub station 104. For example, the notification message should arrive at the hub station 104 with a relatively high signal-to-interference ratio.

In addition, the reserved block transmissions may be used to derive time alignment (synchronization), carrier frequency adjustment and power control information for the remote units 108A–108N, whether or not the reservation block transmission indicates the transmission of a block of data over a contention-type resource. For example, by examining the transmission received over the reserved block 140, the hub station 104 may generate a time, carrier frequency, power adjustment command or other information for transmission to the remote unit 108. Several techniques for time alignment are disclosed in assignee's co-pending application entitled "METHOD AND APPARATUS FOR TIME SYNCHRONIZATION IN A COMMUNICATION SYSTEM," application Ser. No. 09/354,934, filed Jul. 15, 1999, which claims priority to a provisional application having the same title, application Ser. No. 60/095,341, filed Aug. 8, 1998.

Use of the reserved block 140 for these functions may be advantageous because the remote unit 108 can transmit actual or dummy messages over the reserved block 140 without expending any additional system resources and without the risk of collision. By using the reserved block 140 to implement these overhead functions, the loading on the contention-type access block 142 and non-contention access block 144 may be further decreased.

In one embodiment, the reserved block transmissions reflect an amount of data transmitted over a contention-type resource 142. For example, in one embodiment, the reserved block transmission is a payload message which indicates the number of packets transmitted over the contention-type resource 142. If the hub station 104 detects less than the indicated amount of data on the contention-type resource 142, the hub station 104 assigns a non-contention resource 144 of sufficient size to support transmission of the amount of data which was not received and notifies the remote unit 108. The remote unit 108 responds by re-transmitting data over the non-contention resource 144.

In such an embodiment, if a remote unit 108 is transmitting an isochronous data or another type of data where the need for communication resources can be predicted by the remote unit 108, the remote unit 108 can transmit a payload message over the reserved block 140 indicating the transmission of the predicted amount of resources before the data is available for transmission. However, the remote unit 108 does not transmit a corresponding message on the contention-type resource 142. Therefore, the hub station 104 receives the reserved block transmission but not a corresponding contention-type resource transmission and responds with a non-contention resource allocation. The remote unit 108 transmits the data over the non-contention resource 144 when the data is available without incurring the delay of scheduling or the probability of collision on the contention-type resource 142. In addition, because the remote unit 108 does not transmit a message over the contention-type resource 142, the loading and number of collisions on the contention-type resource 142 is reduced.

In some cases, a remote unit 108 transmits predictable data as well as a more unpredictable stream of data. For example, a remote unit 108 may transmit concurrently both a predictable rate voice signal and an unpredictable data signal. In such a case, the remote unit 108 can add the amount of predicted resources to the payload indication sent over the reserved block transmission. For example, if the remote unit 108 has five data packets to transmit and can predict that it will have two additional voice packets to transmit, the remote unit 108 transmits the five data packets over the contention-type resource 142 and transmits a corresponding message over the reserved block 140 indicating that seven data packets are being transmitted. The hub station 104 receives the reserved block transmission and the five data packets and schedules a sufficient non-contention resource 144 to transmit the remaining two packets.

In yet another embodiment, the remote unit 108 transmits a message over the reserved block 140 which indicates the amount of data queued for transmission. For example, the remote unit 108 indicates that a message has been sent over the contention-type resource 142 and that a certain amount of data remains available for transmission. The information concerning queue length can be used by the hub station 104 to allocate appropriate system resources. In practice, this embodiment is a special case of the embodiment described above in which the remote unit 108 transmits a reserved block message which indicates that a greater amount of data is transmitted than is actually received and in which when the hub station 104 assigns a non-contention resource 144 of sufficient size to support transmission of the amount of data which was not received. In effect, the difference between the amount of data transferred and the amount of data indicted in the message is equal to the queue size.

The transmission over the reserved block 140 need not be concurrent with the transmission over the contention-type access block 142. A transmission over the reserved block 140 may indicate that a transmission has been recently made over the contention-type access block 142, that a transmission is concurrently made over the contention-type access block 142 or that a transmission will soon follow over the contention-type access block 142.

In yet another embodiment, the resources of the reserved block 140 can be non-uniformly allocated among the remote units 108A–108N. For example, the resources can be allocated based upon a set of active and quiescent remote units. The active remote units are those remote units which are more likely to transmit data. The quiescent remote units are those remote units which are less likely to transmit data. If no transmissions are received from an active remote unit for an extended period of time, the hub station 104 can re-categorize the remote unit as a quiescent remote unit. If a transmission from a quiescent remote unit is received, the hub station 104 can re-categorize the remote unit as an active remote unit. The active remote units are allocated more frequent access to the reserved block 140 than the quiescent remote units.

Likewise, the resources of the reserved block 140 may be allocated among the remote units 108A–108N according to a quality of service allocated to the user, the data transmission capability of the remote unit 108, the past usage pattern of the remote unit 108 or the length of time since the last transmission was received from the remote unit 108. Non-uniform allocation of the reserved block resources can aid in reducing the overall latency introduced in the system by the use of the reserved block 140.

Likewise, the total amount of system resources dedicated to the reserved block 140 can be varied during system operation. For example, the rigid separation of reserved block 140 and the contention-type access block 142 and the non-contention access block 144 in FIG. 2 can be replaced with a movable separation. By increasing the amount of resources allocated to the reserved block 140, the overall latency of the system due to the use of the reserved block 140 can be reduced. However, increasing the amount of resources allocated to the reserved block 140 reduces the amount of resources which can be allocated to the other access resources. Thus, when sufficient resources are available on the contention-type resource 142 and the non-contention resource 144, additional resources can be allocated to the reserved block 140. As the loading on the contention-type resource 142 and the non-contention resource 144 increases, the amount of resources allocated to the reserved block 140 can be reduced.

As noted above, the communication format used on the reserved block 140, the contention-type access block 142 and the non-contention access block 144 need not be the same. A myriad of well known and later developed communication formats may be directly applied to the teachings of the invention. Typically, the non-contention access and the contention-type access blocks 142–144 use a common communication format and channelization for ease of implementation. In one embodiment, the reserved block 140 operates according to some different communication format.

An important characteristic of the reserved block 140 is that it comprises a sufficient number of discrete resources so that each active remote unit 108 may be assigned a unique resource. The use of uniquely assigned resources allows one remote unit 108 to communicate with the hub station 104 without preventing other remote units from communicating with the hub station 104. In a system with a large number of remote units 108A-108N and a limited time slot allotted to each remote unit 108, it is important to keep the data bursts across the reservation channel 140 short.

It is also important that the transmission delay associated with sending a signal over the reserved resource 140 be limited to some reasonable value. If the time delay associated with successive transmissions from a single remote unit 108 over the reserved block 140 becomes too large, the delay may become significant in determining the delay associated with a retransmission over the non-contention access block 144. Thus, a short data burst across the reserved block 140 allows more frequent data bursts to be sent at a specified rate, and thereby advantageously limits the transmission delay.

Reservation Channel Coding

In FIG. 2, the reserved block 140 of resources comprises a highly efficient narrowband communication channel (referred hereinafter as the "reservation channel 140"). In general, the remote units 108A-108N (FIG. 1) preferably encode the messages before they are sent via the reservation channel 140 to the hub station 104. The hub station 104, in turn, decodes the messages. In one embodiment, the messages are encoded into a non-coherent, quadrature phase shift keying (QPSK) symbol sequence set. Use of a non-coherent code advantageously does not require the determination of a carrier phase associated with the encoded burst during demodulation.

The QPSK symbol sequence set comprises a plurality of possible codewords or code patterns. Each codeword consists of a plurality of 'I' values and plurality of 'Q' values. The individual I and Q digit values are binary, e.g., either +1 or −1. Each QPSK modulated symbol consists of a single I value and a single Q value. The binary I and binary Q values of a symbol taken together effectively generate the four-phase modulation known as QPSK.

Figure 3:
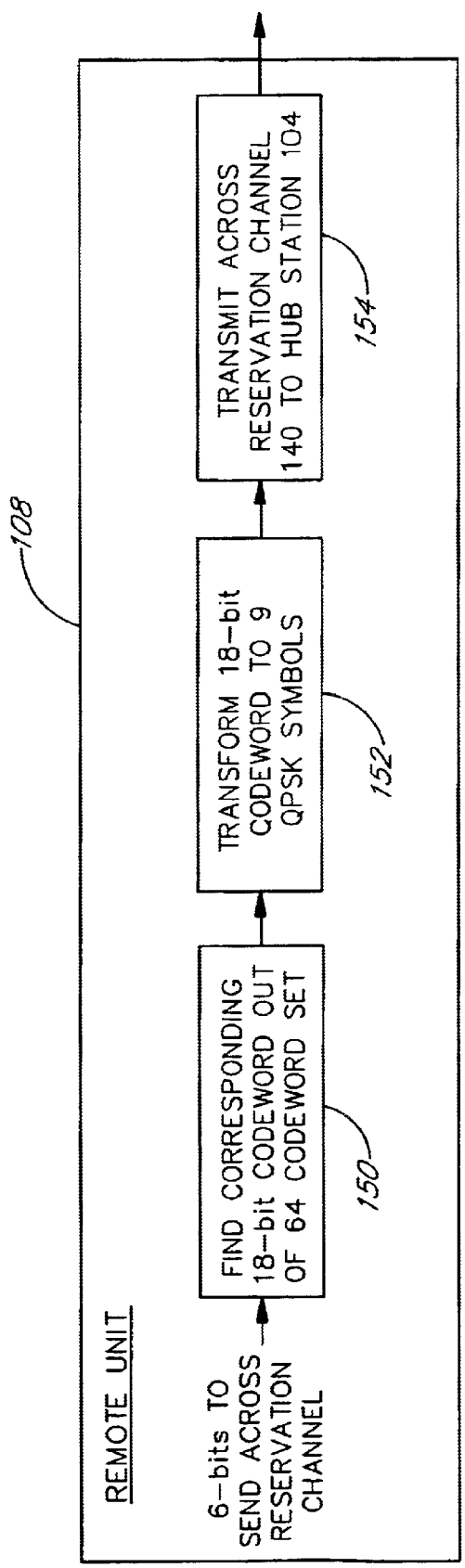
FIG. 3 is a block diagram illustrating a method of encoding data to be transmitted within the system of FIG. 1.

FIG. 3 is a block diagram illustrating a method of encoding data to be transmitted via the reserved block 140 of FIG. 2 within the system of FIG. 1. In FIG. 3, the initial length of each message intended for the reservation channel 140 is six bits. Alternatively, other message lengths greater than six or less than six may be used in accordance with the invention. In an encoder 150, the remote unit 108 encodes a 6-bit message into an 18-bit codeword by using a look-up table. Specifically, the remote unit 108 refers to a codeword set as shown in FIG. 4 and finds a codeword which corresponds to the 6-bit message.

Figure 4A:
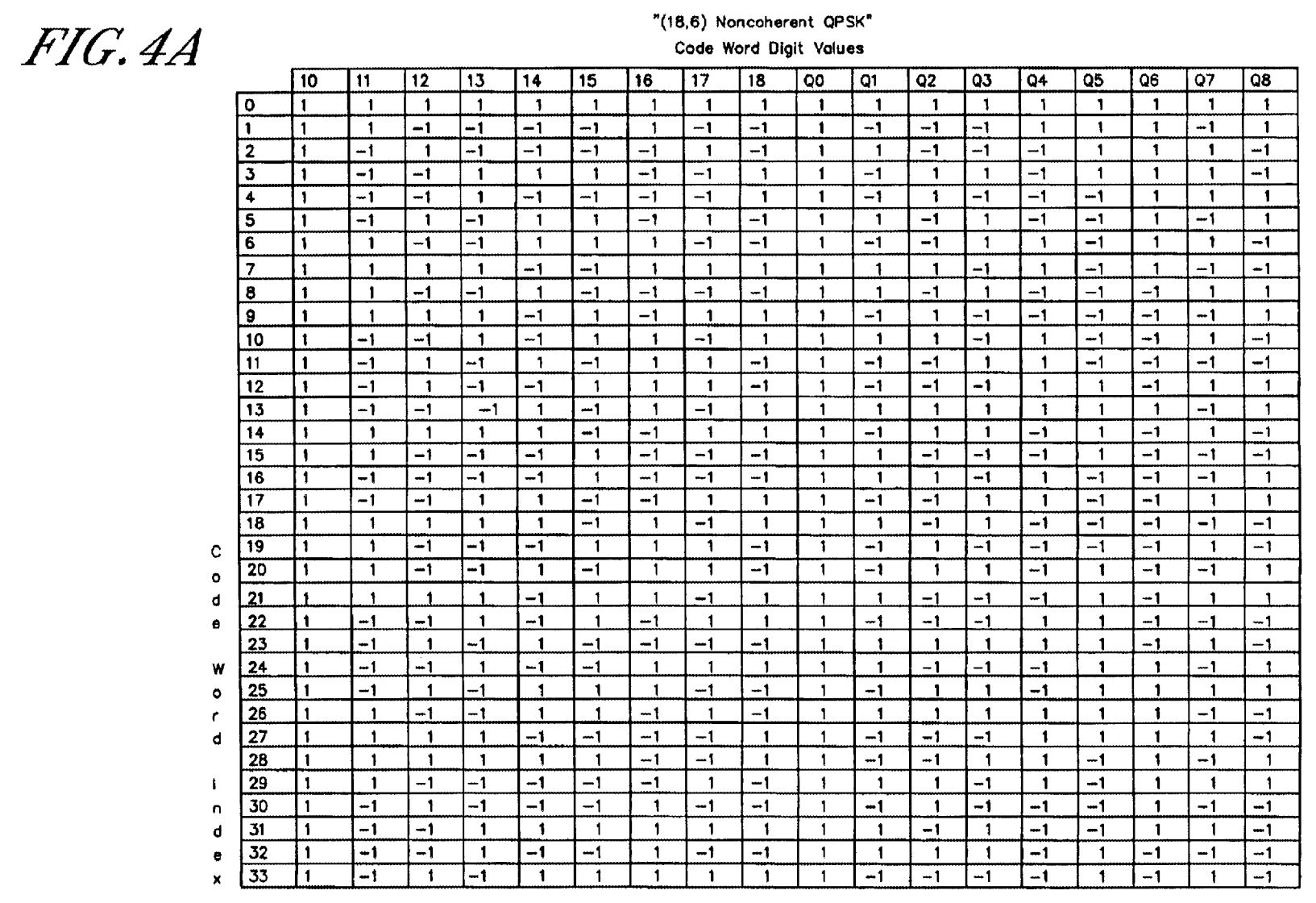
Figure 4B:
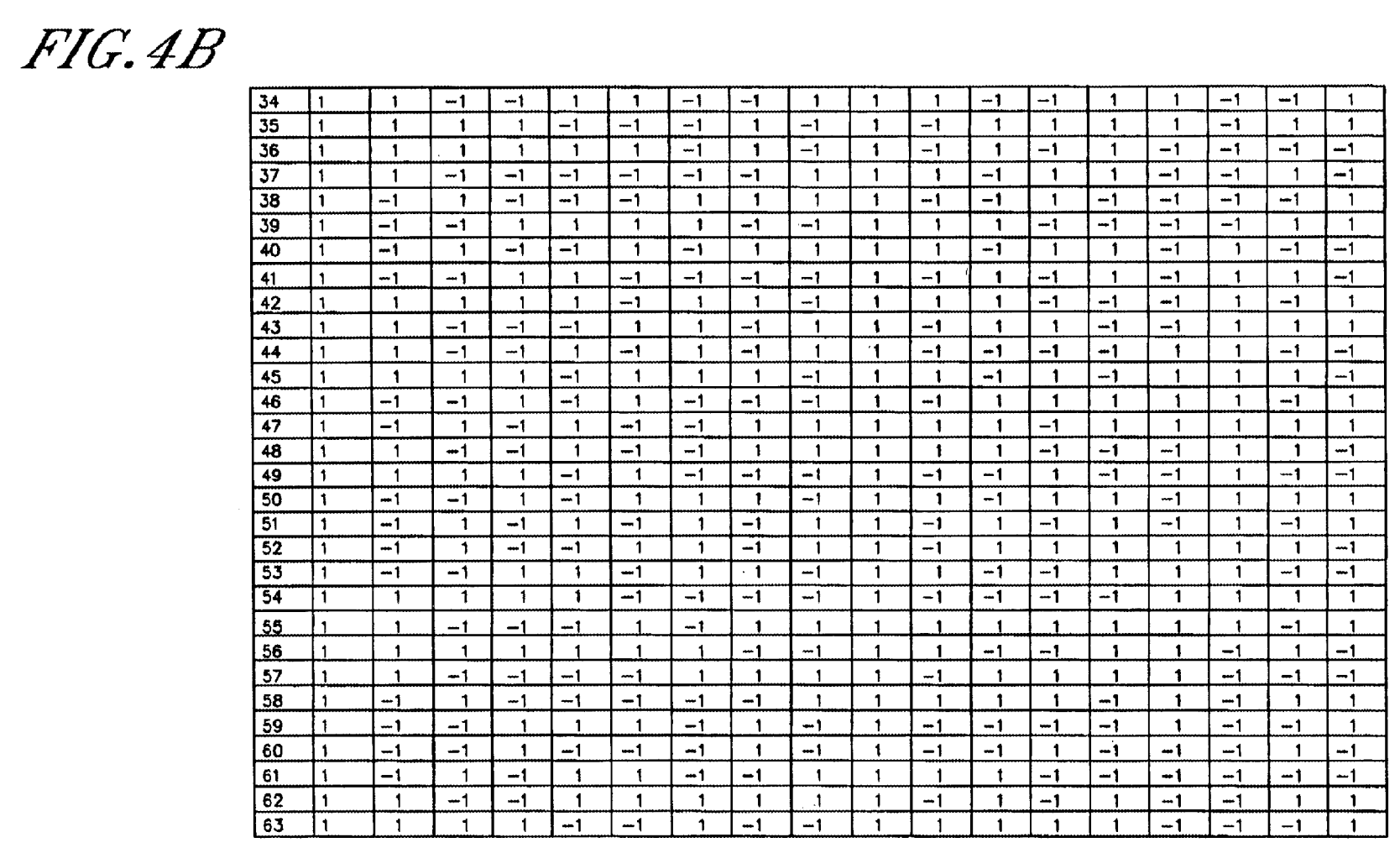

FIG. 4 illustrates one configuration of a set of codewords corresponding to a non-coherent, 9-symbol QPSK symbol sequence set. As shown in FIG. 4, this set comprises $2^6$ or 64 codewords, which corresponds to the initial message length of 6 bits. The 64 codewords are shown as rows in the table of FIG. 4. Each codeword consists of nine I values (I0 through I8), which are shown as the first nine columns in FIG. 4, and nine Q values (Q0 through Q8), which are shown as the second nine columns in FIG. 4.

In a converter 152 of FIG. 3, the remote unit 108 converts the 18-bit codeword to nine QPSK symbols. Because each I value and a corresponding Q value make up a symbol, each codeword corresponds to nine symbols. For example, the second symbol (I1, Q1) of codeword number 2 (third row) in FIG. 4 comprises a value of (−1, 1). In a transmitter 154, the remote unit 108 transmits the symbols across the reservation channel 140 to the hub station 104.

The non-coherent QPSK code set used by one embodiment of the communication system is advantageously created such that each codeword has the same distance configuration from neighboring codewords, i.e., each codeword has the same number of codewords at a given distance as all of the other codewords. This gives each codeword equal noise immunity. The entire codeword data set is also advantageously created to perform well in low signal-to-noise environments for low probability of transmission error.

In alternative embodiments, the remote units 108A-108N may apply other coding techniques or transformations to the messages in addition to or instead of the coding described above. For example, the remote units 108A-108N may convolutionally encode the 6-bit messages into 18-bits, which are then modulated. Also, instead of QPSK, the remote units 108A-108N may use other forms of modulation, such as 8PSK, 16PSK, etc. As mentioned above, other message lengths may be used instead of six, such as 4, 5, 8, 10, 12, etc. In addition, the six message bits may be encoded to any suitable number of bits, symbols or combination of bits and symbols, such as 12, 16, 18, 24, etc.

Reservation Channel Demodulation

Figure 5:
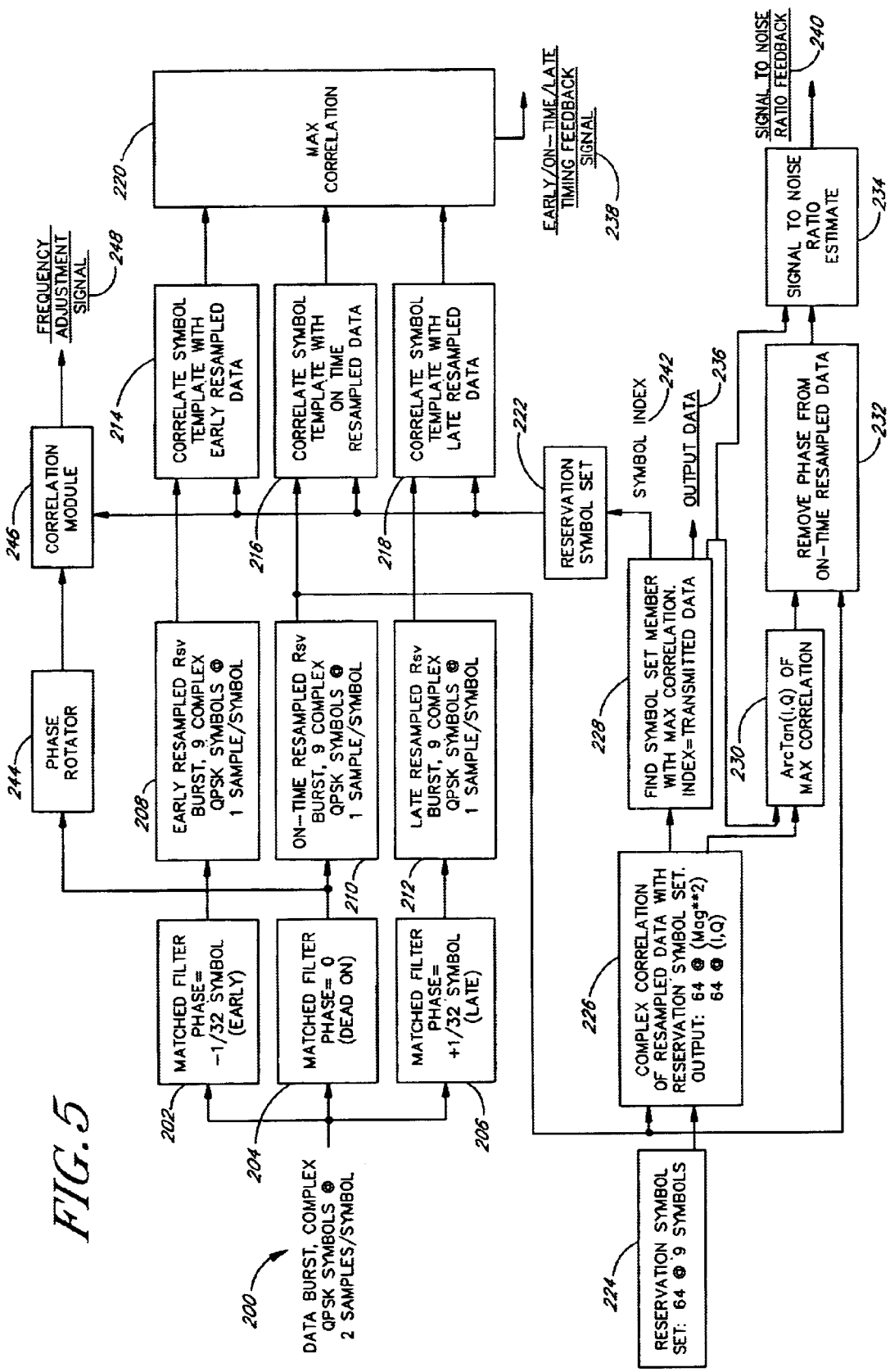
FIG. 5 is a diagram of a method and apparatus which processes bursts of data received by the hub station of FIG. 2.

FIG. 5 is a diagram of one embodiment of a portion of the hub station 104 which processes a burst of data 200 received from a remote unit 108 (FIG. 3) via the reservation channel 140 (FIG. 2). FIG. 5 also illustrates one embodiment of a method of processing the data burst 200 received by a hub station 104 from a remote unit 108 via the reservation channel 140. The portion of the hub station 104 shown in FIG. 5 comprises a polyphase matched filter with three separate timing phases 202, 204, 206, memory spaces 208, 210, 212, 224, correlators 214, 216, 218, 226, a selector 220, a converter 222, a detector 228, a process element 230, a phase remover 232, an estimator 234, a phase rotator 244, and a correlation module 246. Alternatively, in other embodiments, the polyphase matched filter may have less than three or greater than three separate timing phases. Also, in an alternative embodiment, a plurality of filters are used instead of a single polyphase matched filter.

The memory spaces 208, 210, 212, 224 may be a part of a memory unit associated with the hub station 104. In one embodiment, the correlation module 246 comprises elements which are substantially similar to the memory spaces 208, 210, 212, the correlators 214, 216, 218 and the selector 220 shown in FIG. 5.

In a preferred embodiment, the hub station 104 demodulates the reservation channel burst 200 using a complex correlation-based scheme. In one embodiment, the hub station 104 uses one or more standard microprocessors, such as a Pentium III made by Intel, to perform the complex correlations in the correlators 226, 214, 216, 218 and the correlation module 246.

In FIG. 5, the hub station 104 receives an incoming reservation channel burst (or packet) 200 of complex QPSK symbols. The polyphase matched filter within the hub station 104 uses the three separate timing phases 202–206 to resample the incoming reservation channel burst 200 at three different symbol timing hypotheses.

The first timing phase 202 resamples the incoming reservation packet 200 at an 'early' timing hypothesis with a phase set equal to a negative symbol timing offset, such as a $-\frac{1}{32}$ symbol timing offset. This results in an 'early' resampled reservation burst comprising 9 complex QPSK symbols at an effective rate of one sample per symbol. This resampled burst is stored in the memory space 208.

In other configurations, another negative symbol timing offset may be selected and used by the hub station 104, such as $-\frac{1}{8}$, $-\frac{1}{16}$, $-\frac{1}{64}$, etc. The negative symbol timing offset may vary according to the signal-to-noise ratio of the reservation channel 140. If the signal-to-noise ratio is relatively high, then a relatively small negative symbol timing offset may be selected and used by the hub station 104.

The second timing phase 204 resamples the incoming reservation packet 200 at an 'on-time' timing hypothesis with no symbol timing offset. This results in an 'on-time' resampled reservation burst comprising 9 complex QPSK symbols at an effective rate of one sample per symbol. This resampled burst 210 is stored in the memory space 210.

The third timing phase 206 resamples the incoming reservation packet 200 at a 'late' timing hypothesis with a phase set equal to a positive symbol timing offset, such as a $+\frac{1}{32}$ symbol timing offset. This results in a 'late' resampled reservation burst comprising 9 complex QPSK symbols at an effective rate of one sample per symbol. This resampled burst 212 is stored in the memory space 212.

In other configurations, another positive symbol timing offset may be selected and used by the hub station 104, such as $+\frac{1}{8}$, $+\frac{1}{16}$, $+\frac{1}{64}$, etc. The positive symbol timing offset may vary according to the signal-to-noise ratio of the reservation channel 140. If the signal-to-noise ratio is relatively high, then a relatively small positive symbol timing offset may be selected and used by the hub station 104.

The correlator 226 of the hub station 104 assumes that the data burst that is resampled at the 'on-time' hypothesis is correct. The correlator 226 correlates the resampled data (9-symbol burst) at the 'on-time' hypothesis (stored in memory space 210) with all 64 possible 9 symbol (18-bit) reservation channel codewords, each of which is stored in the memory space 224 at the hub station 104.

In one embodiment, the 64 complex correlations are performed by deriving a correlation magnitude as follows:

$$(\text{magnitude})^2 = ((\bar{I}_{received} \bullet \bar{I}_{code}) + (\bar{Q}_{received} \bullet \bar{Q}_{code}))^2 + ((\bar{I}_{received} \bullet \bar{Q}_{code}) - (\bar{I}_{code} \bullet \bar{Q}_{received}))^2$$

where $\bar{I}_{received}$ is 9-sample vector from the received reservation channel burst, $\bar{Q}_{received}$ is a 9-sample vector from the received reservation channel burst, $\bar{I}_{code}$ is a 9-bit vector from a codeword of the 64-codeword set shown in FIG. 4, and $\bar{Q}_{code}$ is a 9-bit vector from a codeword of the 64-codeword set shown in FIG. 4. The symbol '●' in the equation above symbolizes a dot product of two vectors. Each codeword of the 64-codeword set is correlated with the received reservation channel burst. In one configuration, the output of correlator 226 is a set of 64 energy or power levels (magnitudes).

The results of the 64 complex correlations from correlator 226 are transferred to a detector 228, which finds the 18-bit codeword index (symbol sequence set member) with the maximum/highest correlation to the received reservation burst stored in memory space 210. The 18-bit codeword index with the highest correlation magnitude is associated with the most likely 6-bit reservation channel message that was transmitted by the remote unit 108. The detector 228 outputs the 6-bit output data 236 to other components of the hub station 104 for further processing.

The hub station 104 may further process the output data 236 to determine one or more characteristics or events of the remote unit 108 which sent the reservation burst 200. For example, as described above, the hub station 104 may use the output data 236 to determine whether a remote unit 108 has sent a data burst or the size of the queue at the remote unit 108. The hub station 104 may also use the output data 236 to determine the identity of the remote unit 108, the length of the data burst being sent (or to be sent) across the contention channel, the number of data bursts being sent, as well as other information.

Timing Synchronization

In one embodiment, the hub station 104 maintains accurate timing information or synchronization for the reservation channel 140, such as within $+/-\frac{1}{32}$ symbol time offset. The hub station 104 preferably extracts timing information during the demodulation process shown in FIG. 5. In the converter 222, a symbol index (6-bit output) 242 from detector 228 is converted into its corresponding symbol sequence (9 symbol codeword) by referring to the reservation symbol table as shown in FIG. 4. Essentially, converter 222 acts as an encoder.

In correlators 214–218, the symbol sequence from selector 222 is complex correlated with each of the three data bursts stored in memory spaces 208–212 resulting from the early, on-time, and late resampling by the polyphase filter 202–206. In one configuration, the outputs of correlators 214–218 are energy or power levels.

The correlation performed by correlator 216 is the same as the correlation of the samples from the memory space 210 and the chosen codeword value performed by the correlator 226. Therefore, in one embodiment, the corresponding magnitude calculation result is forwarded from the correlator 226 to the selector 220, and the correlator 216 is no longer needed.

The outputs of correlators 214–218 are fed into the selector 220, where the correlations are compared to determine whether the timing of the burst 200 transmitted across the reservation channel 140 was early, late or on-time. Based on the maximum correlation, the selector 220 outputs an early, on-time or late feedback signal 238. The hub station 104 uses the feedback signal 238 to inform the remote unit 108 which sent the reservation burst to advance forward or retard backward in time for its next reservation burst transmission. In one configuration, the hub station 104 sends a 'timing error signal' to the remote unit 108 if the burst 200 transmitted across the reservation channel 140 was early or late. In one embodiment, if the hub station 104 determines that the burst 200 was on-time, the hub station 104 does not send a timing synchronization signal back to the remote unit 108.

For example, if the selector 220 finds that the complex correlation with the data set 212 resulting from the late sampling 206 has the highest magnitude, then the hub station 104 sends a feedback signal 238 to the remote unit 108 instructing the remote unit 108 to advance its next reservation burst transmission forward in time. In other words, the hub station 104 instructs the remote unit 108 to transmit its next reservation burst at an earlier time. This improves the timing of the reservation channel 140 for the remote unit 108.

In one embodiment, the hub station 104 sends a feedback signal 238 to the remote unit 108 after the hub station 104 processes a plurality of reservation channel bursts. In one configuration, the hub station 104 averages a number of maximum correlations before sending a feedback signal 238. In a specific implementation, the hub station 104 averages 10 maximum correlations (based on 10 received bursts 200) to derive a timing feedback signal 238.

Carrier Frequency Adjustment

In one embodiment, the phase rotator 244 and the correlation module 246 of FIG. 5 derive a carrier frequency adjustment signal 248 for the hub station 104 to send back to the remote unit 108. The carrier frequency adjustment signal 248 informs the remote unit 108 to adjust its carrier frequency (rate of change of the carrier phase) for subsequent transmissions. Specifically, the phase rotator 244 receives the 'on-time' resampled reservation burst from the second timing phase 204 and rotates the carrier phase of the burst to create three separate frequency sample sequences: a 'slow' frequency sample sequence, a 'fast' frequency sample sequence and an 'on-frequency' (unaltered frequency) sample sequence. Alternatively, in other embodiments, more than three or less than three frequency sample sequences may be created. The phase rotator 244 outputs the frequency sample sequences to the correlation module 246.

The operation of the correlation module 246 is substantially similar to the operation performed by the memory spaces 208, 210, 212, the correlators 214, 216, 218 and the selector 220 shown in FIG. 5 and described above. The correlation module 246 correlates the symbol sequence from the converter 222 with the three frequency sample sequences (slow, fast and unaltered frequency sample sequences). The correlation module 246 then determines which frequency sample sequence out of the three frequency sample sequences provides the maximum correlation with the symbol sequence from the converter 222. After the correlation module 246 determines if the carrier frequency is too slow, too fast or substantially correct, the correlation module 246 provides a carrier frequency adjustment signal 248 for the hub station 104 to send back to the remote unit 108 to adjust the remote unit's transmission carrier frequency, if needed.

In one embodiment, the hub station 104 sends a carrier frequency adjustment signal 246 to the remote unit 108 after the hub station 104 processes a plurality of reservation channel bursts. In one configuration, the hub station 104 averages a number of maximum correlations before sending a carrier frequency adjustment signal 246. In a specific implementation, the hub station 104 averages 10 maximum correlations (based on 10 received bursts 200) to derive a carrier frequency adjustment signal 246.

Estimating a Signal to Noise Ratio

In a preferred embodiment, an output from the correlator 226 and an output from the detector 228 are input into the process element 230. The process element 230 uses the inputs from the correlator 226 and the detector 228 to derive a real component ($I_{max\ correlation}$) and an imaginary component ($Q_{max\ correlation}$), which are associated with the complex correlation for the selected codeword found by detector 228. Specifically, the codeword with the maximum complex correlation magnitude found in detector 228 has an associated ($I_{max\ correlation}$, $Q_{max\ correlation}$) value pair:

$$I_{max\ correlation} = (\bar{I}_{received} \bullet \bar{I}_{selected}) + (\bar{Q}_{received} \bullet \bar{Q}_{selected})$$

$$Q_{max\ correlation} = (\bar{I}_{received} \bullet \bar{Q}_{selected}) - (\bar{I}_{selected} \bullet \bar{Q}_{received})$$

where $\bar{I}_{selected}$ and $\bar{Q}_{selected}$ are the I and Q vectors of the selected received codeword. In the process element 230 of FIG. 5, the ($I_{max\ correlation}$, $Q_{max\ correlation}$) value pair is used to determine a phase rotation or phase estimate of the received data by using the equation:

$$\text{phase} = \text{ArcTan}\ 2(I_{max\ correlation}, Q_{max\ correlation})$$

where ArcTan 2 is a four-quadrant arctangent function.

In the phase remover 232, the phase estimate derived in process element 230 is removed from the on-time resampled data by derotating the on-time resampled reservation data 210 by the derived phase estimate. In other words, the phase remover 232 rotates the on-time resampled reservation data by −1 multiplied by the derived phase estimate.

In the estimator 234, the derotated on-time resampled reservation data from the phase remover 232 is used to estimate a signal-to-noise ratio (SNR) at which the burst 200 is received. There are a number of methods to estimate a signal-to-noise ratio in the estimator 234 of FIG. 5. In one embodiment, the method involves forming two sums:

$$SUM_{ABS} = \bar{I}_{derotated} \bullet \bar{I}_{selected} + \bar{Q}_{derotated} \bullet \bar{Q}_{selected}$$

$$SUM_{SQR} = \bar{I}_{derotated} \bullet \bar{I}_{selected} + \bar{Q}_{derotated} \bullet \bar{Q}_{selected}$$

where $\bar{I}_{derotated}$ and $\bar{Q}_{derotated}$ are the I and Q vectors of the derotated on-time resampled reservation data (from the phase remover 232), and $\bar{I}_{selected}$ and $\bar{Q}_{selected}$ are the I and Q vectors of the selected received codeword (from the detector 228). $SUM_{ABS}$ represents the sum of absolute values, and $SUM_{SQR}$ represents the sum of square root values. $SUM_{ABS}$ and $SUM_{SQR}$ are accumulated over an N number of reservation bursts to produce $SUM_{ABS}N$ and $SUM_{SQR}N$. The signal-to-noise ratio is estimated to be:

$$SNR = 10\ \log_{10}[(SUM_{ABS}N)/((N)(B)(SUM_{SQR}N) - SUM_{ABS}N)]$$

where B represents the number of code bits per reservation burst. In one of the embodiments described above, B is equal to 18. Alternatively, in other embodiments, some other method may be used to estimate a signal-to-noise ratio by using the complex correlation results.

The hub station 104 uses the estimated signal-to-noise ratio from the estimator 234 to determine whether the reservation channel 140 is active, e.g., whether a reservation burst was actually received or not. If the estimated SNR is below a first predetermined threshold, then the hub station 104 does not process the output data 236 generated from detector 228.

In one embodiment, if the estimated signal-to-noise ratio is below a second predetermined threshold, then the hub station 104 does not use the timing feedback signal 238 to adjust the timing of the remote unit's next transmission across the reservation channel 140. This can be implemented as an enable/disable line from estimator 234 to the selector 220. In one embodiment, this second predetermined threshold is the same as the first predetermined threshold. Alternatively, in other embodiments, the second predetermined threshold is greater than or less than the first predetermined threshold.

In one embodiment, the estimated signal-to-noise ratio is used by the hub station 104 to maintain transmit power for the remote unit 108 across the reservation channel 140. Specifically, based on the estimated signal-to-noise ratio, the hub station 104 sends one or more control messages to the remote unit 108 which instruct the remote unit 108 to increase or decrease power.

The present invention may be embodied in a variety of systems in which multiple units compete for access to a finite resource. Such systems include wireless terrestrial systems and wireline systems.

The invention may be embodied in other specific forms without departing from its spirit or essential characteristics. The described embodiment is to be considered in all respects only as illustrative and not restrictive and the scope of the invention is, therefore, indicated by the appended claims rather than the foregoing description. All changes which come within the meaning and range of equivalency of the claims are to be embraced within their scope.

What is claimed is:

1. In a communication system in which a plurality of remote units transmit data to a hub station, a method of communicating comprising:
   receiving a data burst from a remote unit, the data burst being encoded using a predetermined codeword set;
   sampling the data burst received by the hub station at a plurality of different timing offsets;
   correlating the data burst received by the hub station with the codeword set to find a codeword with maximum correlation;
   correlating the codeword having the maximum correlation with one or more of the plurality of different timing offset samples;
   deriving a timing synchronization signal, the timing synchronization signal providing information to the remote unit to synchronize its timing for transmitting subsequent data bursts; and
   sending the timing synchronization signal to the remote unit.

2. The method of claim 1, further comprising:
   encoding a data burst at a remote unit using a predetermined codeword set; and
   transmitting the encoded data burst from the remote unit to the hub station over a multiple-access channel.

3. The method of claim 1, further comprising sending the timing synchronization signal back to the remote unit after a plurality of data bursts from the remote unit have been received and processed by the hub station, the timing synchronization signal being based on a plurality of correlations of the data bursts with the codeword set.

4. The method of claim 1, further comprising deriving a carrier frequency adjustment signal to be sent back to the remote unit, the carrier frequency adjustment signal providing information to the remote unit to adjust a carrier frequency for transmitting subsequent data bursts.

5. The method of claim 4, further comprising rotating a carrier phase of the data burst to create three separate frequency sample sequences comprising:
   a slow frequency sample sequence;
   a fast frequency sample sequence; and
   an on-frequency sample sequence.

6. The method of claim 4, further comprising sending the carrier frequency adjustment signal back to the remote unit after a plurality of data bursts from the remote unit have been received and processed by the hub station, the carrier frequency adjustment signal being based on a plurality of correlations of the data bursts with the codeword set.

7. The method of claim 1, wherein the plurality of different timing offsets comprises an early offset resample, an on-time sample and a late offset sample.

8. The method of claim 1, wherein the data burst is encoded using a predetermined, non-coherent QPSK codeword set.

9. The method of claim 8, wherein the QPSK codeword set comprises 64 9-symbol codewords in which each codeword has equal noise immunity.

10. The method of claim 8, further comprising demodulating the encoded data burst using noncoherent demodulation.

11. The method of claim 1, wherein the data burst does not have a preamble.

12. In a communication system in which a plurality of remote units transmit data to a hub station, a method of communicating comprising:
    receiving a data burst from a remote unit, the data burst encoded using a predetermined codeword set;
    sampling the data burst received by the hub station at a plurality of different timing offsets;
    correlating the data burst received by the hub station with the codeword set to find a codeword with maximum correlation;
    correlating the codeword having the maximum correlation with the plurality of different timing offset samples;
    deriving a carrier frequency adjustment signal, the carrier frequency adjustment signal providing information to the remote unit to adjust a carrier frequency for transmitting subsequent data bursts; and
    sending the carrier frequency adjustment signal to the remote unit.

13. In a system in which multiple remote units compete for limited communication resources to access a hub station, a hub station comprising:
    a receiver adapted to receive a data burst from a remote unit;
    a matched filter adapted to sample the received data burst at a plurality of different timing offsets;
    a microprocessor adapted to correlate the received data burst with a plurality of codewords from a codeword set to find a codeword with maximum correlation; and
    a timing synchronization circuit adapted to send a signal back to the remote unit, the signal providing information to the remote unit to synchronize its timing for transmitting subsequent data bursts.

14. The hub station of claim 13, further comprising a carrier frequency adjustment circuit adapted to correlate the codeword having the maximum correlation found by the microprocessor with a plurality of different carrier frequency offset samples, the carrier frequency adjustment circuit being adapted to send a carrier frequency adjustment signal to the remote unit, the carrier frequency adjustment signal providing information to the remote unit to adjust a carrier frequency for transmitting subsequent data bursts.

* * * * *